US012690270B2

(12) United States Patent
Hung et al.

(10) Patent No.: US 12,690,270 B2
(45) Date of Patent: Jul. 21, 2026

(54) ELECTRONIC DISPLAY DEVICE WITH HORIZONTAL CONNECTION ELECTRODE CONNECTING POWER LINES IN PERIPHERAL REGION

(71) Applicant: InnoLux Corporation, Miao-Li County (TW)

(72) Inventors: Wen-Bin Hung, Miao-Li County (TW); Cheng-Wei Lee, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 441 days.

(21) Appl. No.: 18/450,593

(22) Filed: Aug. 16, 2023

(65) Prior Publication Data

US 2024/0105739 A1 Mar. 28, 2024

(30) Foreign Application Priority Data

Sep. 27, 2022 (CN) .......................... 202211184227.7

(51) Int. Cl.
*H10D 86/60* (2025.01)
*H10D 86/40* (2025.01)

(52) U.S. Cl.
CPC ........... *H10D 86/60* (2025.01); *H10D 86/443* (2025.01); *H10D 86/451* (2025.01)

(58) Field of Classification Search
CPC .... H10D 86/60; H10D 86/443; H10D 86/451; H10D 86/441; H10K 59/1213; G02F 1/133; G02F 1/1333; G09F 9/33; H10H 29/142
See application file for complete search history.

(56) References Cited

U.S. PATENT DOCUMENTS

2022/0415992 A1* 12/2022 Park ....................... H10K 50/88

FOREIGN PATENT DOCUMENTS

| CN | 109870855 A | 6/2019 |
| CN | 114270522 A | 4/2022 |
| TW | I454807 B | 10/2014 |
| TW | 201535029 A | 9/2015 |
| TW | 202002357 A | 1/2020 |

OTHER PUBLICATIONS

Chinese language office action dated 2024-03-18, issued in application No. TW 112110217. Six total pages.
Chinese language office action dated Oct. 7, 2025, issued in application No. TW 112110217.

* cited by examiner

*Primary Examiner* — John P. Dulka
(74) *Attorney, Agent, or Firm* — McClure, Qualey & Rodack, LLP

(57) ABSTRACT

An electronic device includes a substrate, a conductive structure disposed on the substrate, and a first insulating island disposed on the conductive structure. The conductive structure includes a first conductive component, a second conductive component, and a third conductive component. The third conductive component is disposed on the first conductive component and the second conductive component. The third conductive component is electrically connected to the first conductive component and the second conductive component. In a cross-sectional view of the electronic device, the width of the first insulating island is greater than the width of the third conductive component.

19 Claims, 10 Drawing Sheets

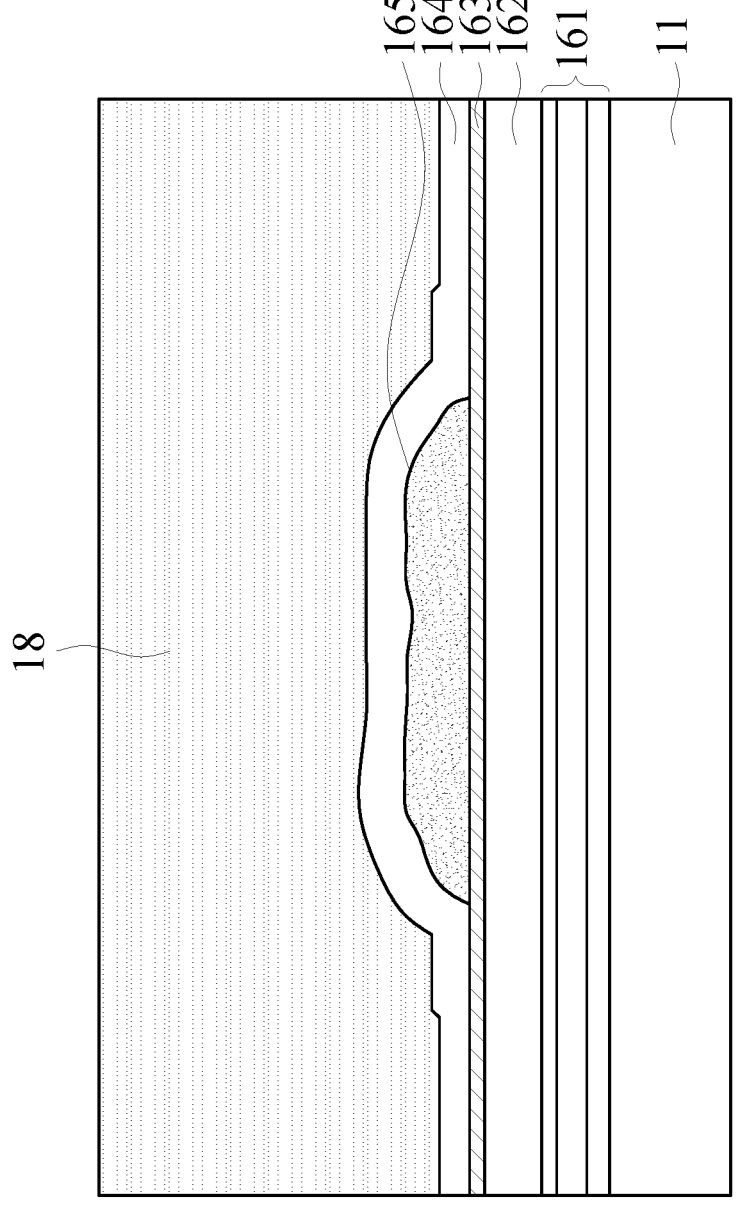
FIG. 8B
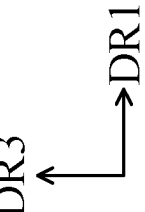

ELECTRONIC DISPLAY DEVICE WITH HORIZONTAL CONNECTION ELECTRODE CONNECTING POWER LINES IN PERIPHERAL REGION

CROSS REFERENCE TO RELATED APPLICATIONS

This application claims priority of China Patent Application No. 202211184227.7, filed on Sep. 27, 2022, the entirety of which is incorporated by reference herein.

BACKGROUND OF THE INVENTION

Field of the Invention

The present disclosure relates to an electronic device, and, in particular, to an electronic device that includes a conductive structure and an insulating island.

Description of the Related Art

With the developments being made in the electronics industry, the size of electronic devices is decreasing as the number of electronic units disposed in those electronic devices (per unit area) is increasing. As this happens, the design of the layout and the arrangement of wires in electronic devices are becoming more complicated. These electronic devices are susceptible to failing due to scratches, which can be caused by external objects falling on them during the manufacturing process.

BRIEF SUMMARY OF THE INVENTION

An embodiment of the present disclosure provides an electronic device including a substrate, a conductive structure disposed on the substrate, and a first insulating island disposed on the conductive structure. The conductive structure includes a first conductive component, a second conductive component, and a third conductive component. The third conductive component is disposed on the first conductive component and the second conductive component and electrically connected to the first conductive component and the second conductive component. In a cross-sectional view of the electronic device, the width of the first insulating island is greater than the width of the third conductive component.

BRIEF DESCRIPTION OF THE DRAWINGS

The present disclosure can be more fully understood by reading the subsequent detailed description and examples with references made to the accompanying drawings, wherein:

FIG. 8B shows an enlarged schematic view of an area C of the electronic device shown in FIG. 8A according to another embodiment of the disclosure;

DETAILED DESCRIPTION OF THE INVENTION

Figure 1:
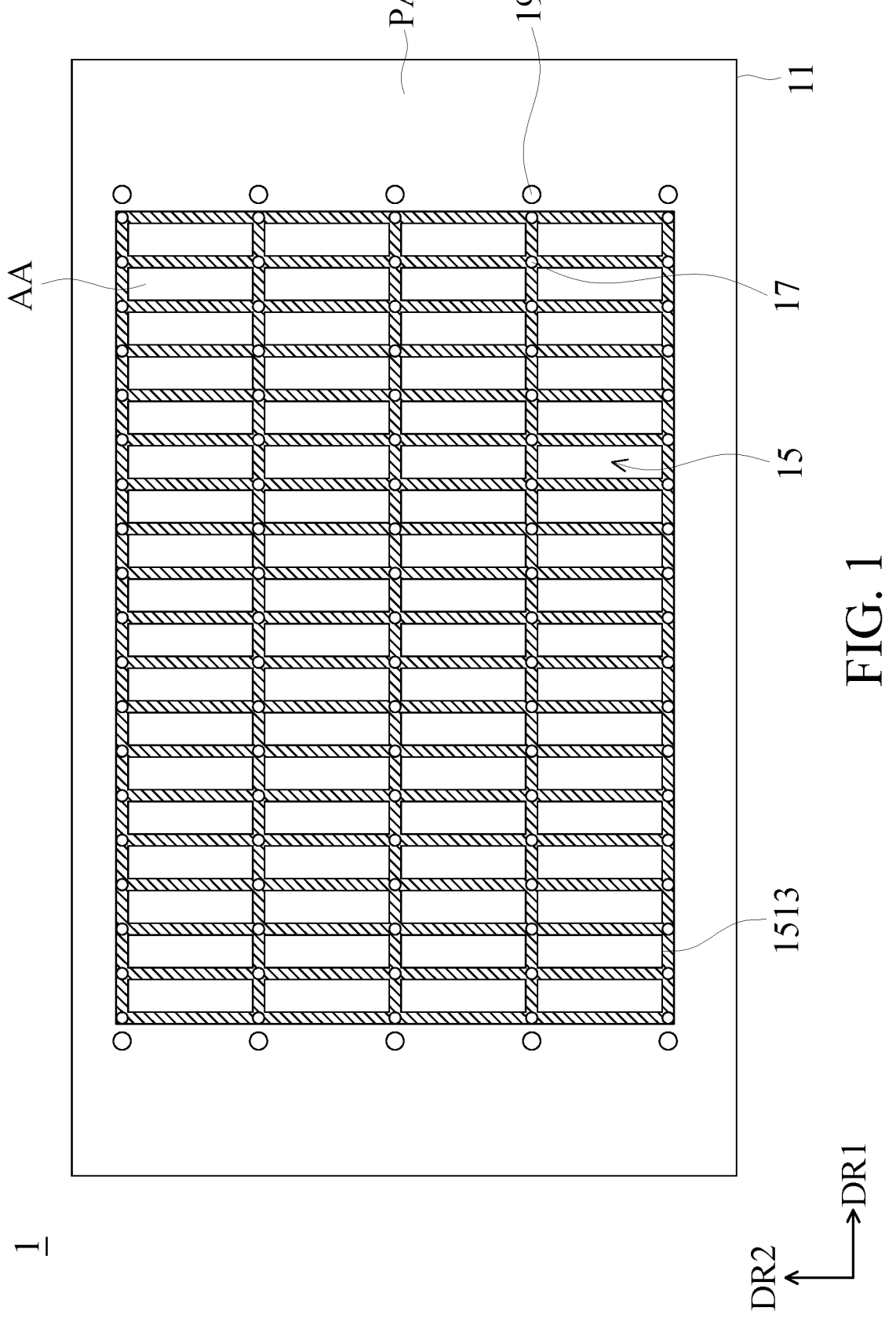
FIG. 1 shows a top schematic view of an electronic device according to an embodiment of the present disclosure.

The following is a detailed description of elements of some embodiments of the present disclosure. It should be understood that, in the following description, various embodiments and examples are provided in order to implement the different aspects of some embodiments of the present disclosure. The specific elements and arrangements described in the following description are set forth in order to describe some embodiments of the present disclosure in a clear and easy manner. Of course, these are only used as examples but not as limitations of the present disclosure. In addition, repeated symbols or labels may be used in different embodiments. These repetitions are made only for the purpose of briefly and clearly describing some embodiments of the present disclosure and do not imply any correlation between the different embodiments and/or structures discussed. Furthermore, when a first material layer is described as being on or above a second material layer, the description includes situations where the first material layer is in direct contact with the second material layer. Alternatively, the description may include situations where there are one or more other material layers spaced apart the first material layer and the second material layer. In these situations, the first material layer may not be in direct contact with the second material layer.

In the disclosure, the terms "approximate," "about," and "approximately" usually indicates a value of a given value or range that varies within 10%, or within 5%, or within 3%, or within 2%, or within 1%, or within 0.5%. The value given here are approximate value, i.e., "approximate," "about," or "approximately" may be implied without specifying "approximate," "about," or "approximately". In the disclosure, the term "a-b" indicates a value which is greater than or equal to a and less than or equal to b. In the disclosure, the term "less than or equal to" indicates a specific range including a given value and values below the given value, and the term "greater than or equal to" indicates a specific range including a given value and values above the given value. Conversely, the term "less than" indicates a specific range including values below the given value but not including the given value, and the term "greater than" indicates a specific range including values above the given value but not including the given value. For example, the term "greater than or equal to a" indicates a specific range including a and values above a, and "greater than a" indicates a specific range including values above a but not a.

It should be understood that, although the terms "first", "second", "third" etc. are used herein to describe various elements, components, area, layer, or parts, these elements, components, area, layer, or parts should not be limited by these terms. These terms are only used to distinguish one elements, components, area, layer, or parts from other elements, components, area, layer, or parts. Thus, a first elements, components, area, layer, or parts discussed below could be termed as a second elements, components, area, layer, or parts without departing from the teachings of the present disclosure.

It should be understood that relative terms such as "under", "on", "horizontal", "vertical", "below", "above", "top", "bottom", etc. shall be construed to indicate orientations shown in the paragraph and the related accompanying drawings. The relative terms are used for explanatory purposes only and does not imply that the device described is manufactured or operated in a specific orientation. Unless otherwise defined, the terms such as "connect" and "interconnect" may indicate that the two structures are in direct contact, or that the two structures are not in direct contact and some other structure is located between them. The terms "connect" and "interconnect" may also include situations where both structures are movable, or where both structures are fixed.

Unless defined otherwise, all technical and scientific terms used herein have the same meaning as commonly understood by one of ordinary skills in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined. For example, without specific defined, the term size may indicate area, length, width or thickness, but the present disclosure is not limited thereto.

The electronic device of the present disclosure may include a display device, an antenna device, a sensing device, or a splicing device, but the present disclosure is not limited thereto. The electronic device maybe a bendable or flexible electronic device. The display device may be a non-self-luminous display device or a self-luminous display device. The antenna device may be a liquid crystal antenna or a non-liquid crystal antenna, the sensing device may be a sensing device for sensing capacitance, light, heat or ultrasonic, but the present disclosure is not limited thereto. Electronic elements may include passive elements and active elements, such as capacitors, resistors, inductors, diodes, transistors, and the like. The diodes may include light-emitting diodes or photodiodes. The light-emitting diodes may include organic light-emitting diodes or inorganic light-emitting diodes. The light-emitting diodes may include, for example, organic light-emitting diodes (OLED), mini light-emitting diodes (mini LED), micro light-emitting diodes (micro LED), or quantum dot light-emitting diodes (quantum dot LED), but the present disclosure is not limited thereto. The splicing device may include, for example, a display splicing device or an antenna splicing device, but the present disclosure is not limited thereto. It should be noted that the electronic device may be any combination of the foregoing, but the present disclosure is not limited thereto.

Some embodiments of the present disclosure may be understood in conjunction with the drawings. The drawings of the embodiments of the present disclosure may also be regarded as a part of the description of the embodiments of the present disclosure. It should be understood that the drawings of the embodiments of the present disclosure are not shown in proportion to actual devices and elements. The shapes and thicknesses of the embodiments may be exaggerated in the drawings in order to clearly show the features of the embodiments of the present disclosure. In addition, the structures and devices in the drawings are schematically shown in order to clearly show the features of the embodiments of the present disclosure.

FIG. 1 is a top schematic view of an electronic device 1 according to an embodiment of the present disclosure. In order to describe the structure of the electronic device 1 more clearly, FIG. 1 omits conductive structures disposed in a peripheral area. Referring to FIG. 1, the present disclosure provides the electronic device 1 including a first substrate 11, a second substrate (not shown), a pixel unit 15, a second insulating island 17, and a fourth insulating island 19. The first substrate 11 is disposed opposite to the second substrate, and the pixel unit 15, the second insulating island 17, and the fourth insulating island 19 may be disposed between the first substrate 11 and the second substrate. The first substrate 11 includes an active area AA and a peripheral area PA, wherein the peripheral area PA is adjacent to the active area AA. The pixel unit 15 is disposed on the first substrate 11 and corresponding to the active area AA of the first substrate 11. The second insulating island 17 is disposed in the active area AA of the first substrate 11, and the fourth insulating island 19 is disposed in the peripheral area PA of the first substrate 11.

The first substrate 11 and the second substrate (not shown) may include a flexible substrate, a rigid substrate or a combination thereof, but the present disclosure is not limited thereto. In some embodiments, the first substrate 11 may include a transparent substrate or a semi-transparent substrate. According to some embodiments, materials of the first substrate 11 may include glass, quartz, sapphire, ceramics, polyimide (PI), polycarbonate (PC), polyethylene terephthalate (PET), polypropylene (PP), other suitable materials, or any combination of the foregoing, but the present disclosure is not limited thereto.

The electronic device 1 also includes data lines and scan lines (not shown) disposed on the first substrate 11. The data lines and the scan lines are interlaced with each other to form pixel areas. The pixel units 15 may be disposed in the pixel areas. The pixel units 15 may include liquid crystals, organic LEDs, inorganic LEDs, or other suitable electronic elements, but the present disclosure is not limited thereto. According to design requirements, the pixel units 15 may emit lights having different colors or the same color, but the present disclosure is not limited thereto. In some embodiments, the electronic device 1 further includes an optical layer. The optical layer may allow light within a specific wavelength range to pass through or convert a wavelength of light into a wavelength within the specific wavelength range. Therefore, the pixel unit 15 may display different color lights, but the disclosure is not limited thereto. In some embodiments, the electronic device 1 further includes a light-shielding layer 1513, which may shield light and overlap the data lines and scan lines (not shown). In some embodiments, the light-shielding layer 1513 may include dark resins, dark photoresists, dark inks, dark pigments, metals or alloys having low reflectivity, or any combination of the foregoing. In some embodiments, the light-shielding layer 1513 may include black resins, black photoresists, black inks, black pigments, black metals or alloys, or any combination of the foregoing, but the present disclosure is not limited thereto. In some embodiments, the light-shielding layer 1513 is disposed on the first substrate 11 and includes a plurality of openings. The openings are arranged in a matrix form. The pixel units 15 may display different color lights through the openings without color mixing, but the present disclosure is not limited thereto.

The second insulating island 17 is disposed in the active area AA. The fourth insulating island 19 is disposed in the peripheral area PA of the first substrate 11 and adjacent to the active area AA. The second insulating island 17 and the fourth insulating island 19 are disposed between the two substrates to support the two substrates and/or maintain a distance between the two substrates. In some embodiments, the fourth insulating island 19 is disposed in the peripheral area PA of the first substrate 11 and surrounding the active area AA. The projection of the fourth insulating island 19 onto the first substrate 11 does not overlap the projection of the pixel units 15 onto the first substrate 11. In some embodiments, the height of the second insulating island 17 is greater than or equal to the height of the fourth insulating island 19. In some embodiments, the height of the second insulating island 17 and the height of the fourth insulating island 19 are greater than or equal to 3 micrometers (um). The second insulating island 17 and the fourth insulating island 19 may independently have cylindrical shapes, elliptical cylindrical shapes, prismatic shapes, or irregular column shapes. For example, in some embodiments, both the second insulating island 17 and the fourth insulating island 19 have cylindrical shapes, as shown in FIG. 1. In some embodiments, the second insulating island 17 has a cylindrical shape and the fourth insulating island 19 has a prismatic shape. The material of the second insulating island 17 and the fourth insulating island 19 may include acrylic resins, polyamides, polyimides, novolac epoxy resins, other suitable materials, or any combination of the foregoing, but the present disclosure is not limited thereto.

Figure 2:
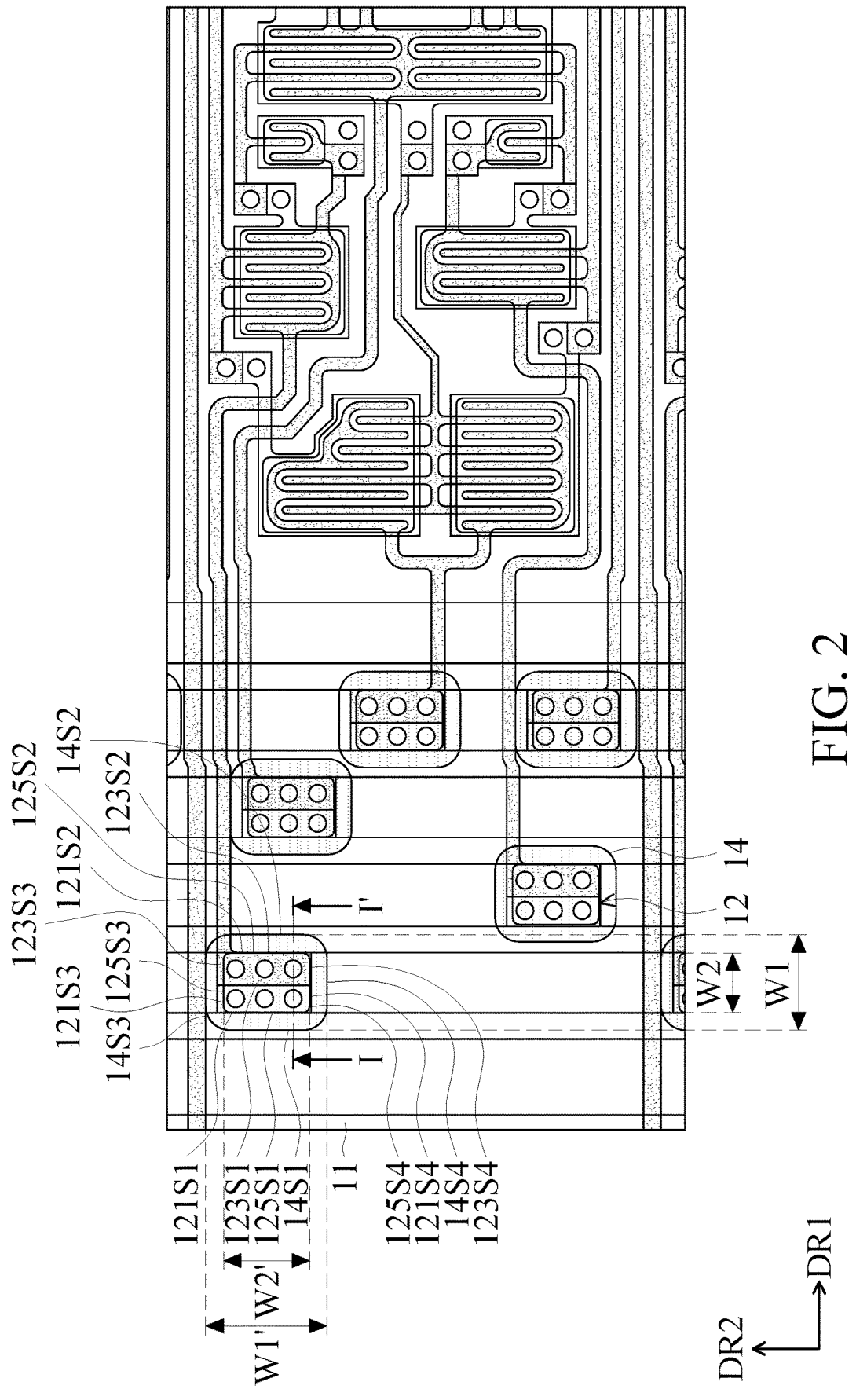
FIG. 2 shows an enlarged schematic view of a peripheral area of the electronic device shown in FIG. 1 according to an embodiment of the disclosure.
Figure 3:
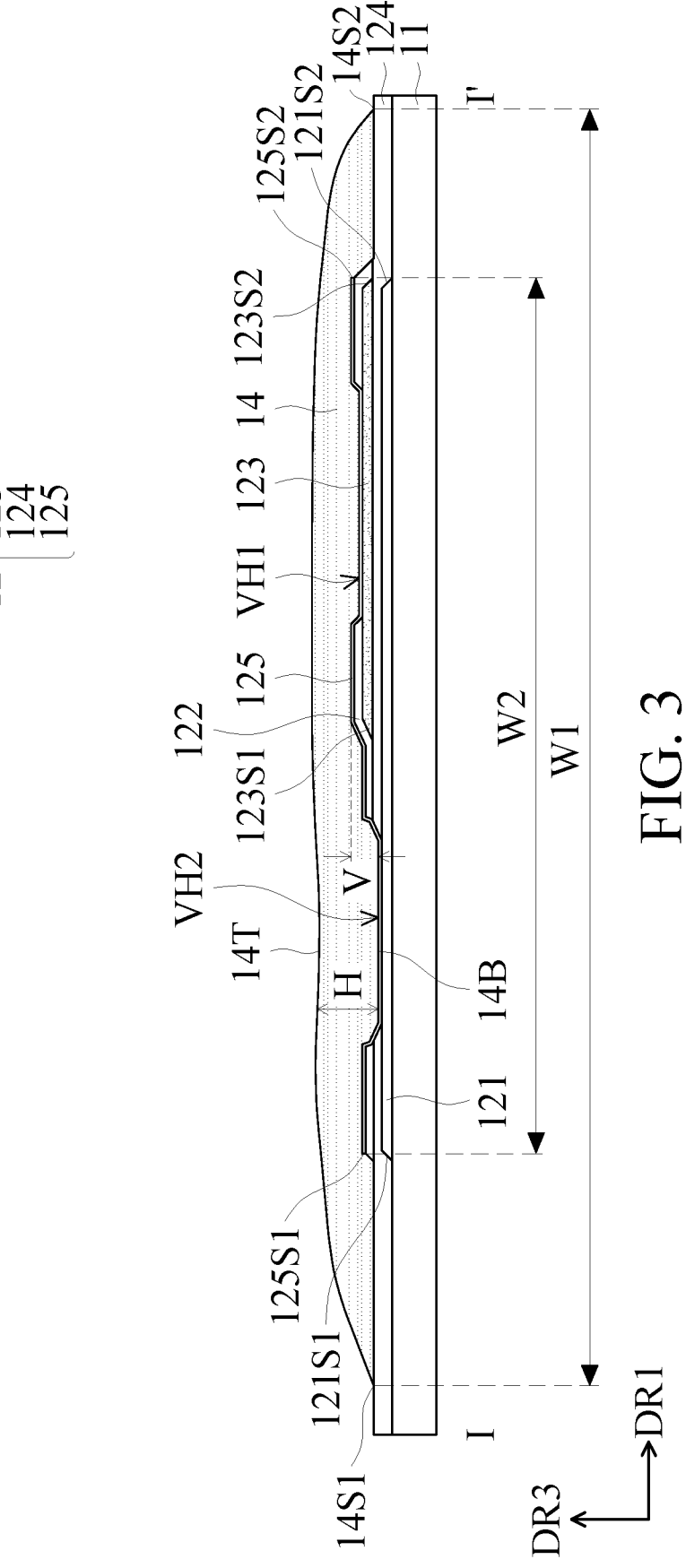
FIG. 3 shows a cross-sectional schematic view of an electronic device according to an embodiment of the present disclosure.

FIG. 2 shows an enlarged schematic view of a peripheral area of the electronic device shown in FIG. 1 according to an embodiment of the disclosure. Referring to FIG. 2, it can be seen that a conductive structure 12 and a first insulating island 14 covering the conductive structure 12 are disposed in the peripheral area PA of the first substrate 11. The conductive structure 12 may be electrically connected to elements in the active area AA or transmit external signals to the active area AA through conductive lines. FIG. 3 shows a cross-sectional schematic view of the peripheral area PA shown in FIG. 2 taken along line I-I'.

In the embodiment shown in FIG. 3, the conductive structure 12 includes a first conductive component 121, a first insulating layer 122, a second conductive component 123, a second insulating layer 124, and a third conductive component 125. The first conductive component 121 is disposed on the first substrate 11, the second conductive component 123 is disposed on the first conductive component 121, and the third conductive component 125 is disposed on the first conductive component 121 and the second conductive component 123. The first insulating layer 122 is disposed between the first conductive component 121 and the third conductive component 125 and between the second conductive component 123 and the third conductive component 125. The second insulating layer 124 is disposed between the first conductive component 121 and the second conductive component 123 and between the first insulating layer 122 and the first conductive component 121.

Materials of the first insulating layer 122 and the second insulating layer 124 may include silicon oxides (SiOx), silicon nitrides (SiNx), silicon oxynitrides or any combination thereof.

A first via hole VH1 penetrates through the first insulating layer 122. A second via hole VH2 penetrates through the first insulating layer 122 and the second insulating layer 124. The first insulating layer 122 may have a plurality of first holes VH1. The first direction DR1 is defined as the extension direction of the line connecting the first via hole VH1 and the second via hole VH2 and passing through the first conductive component 121 and the second conductive component 123. The second direction DR2 is perpendicular to the first direction DR1.

In some embodiments, the first direction DR1 may be the extending direction of the long side of the first substrate 11, and the second direction DR2 may be an extending direction of the short side of the first substrate 11, but the disclosure is not limited thereto. In other embodiments, the first direction DR1 may intersect with the extending direction of the long side of the first substrate 11, and the second direction DR2 may intersect with the extending direction of the short side of the first substrate 11. For easy understanding, the present disclosure is described by taking the first direction DR1 as the extending direction of the long side of the first substrate 11 and the second direction DR2 as the extending direction of the short side of the first substrate 11 as an example.

In some embodiments, the first insulating layer 122 has a height in the third direction DR3. The third direction DR3 is perpendicular to the first direction DR1 and the second direction DR2 (i.e. the normal direction of the first substrate 11). The height of the first insulating layer 122 is less than the width of the first insulating layer 122 in the first direction DR1 or the second direction DR2. The ratio of the width of the first insulating layer 122 in the first direction DR1 or the second direction DR2 to the height of the first insulating layer 122 is less than $10^{-5}$. In some embodiments, the second insulating layer 124 has a height in the third direction DR3. The third direction DR3 is perpendicular to the first direction DR1 and the second direction DR2 (i.e. the normal direction of the first substrate 11). The height of the second insulating layer 124 is less than the width of the second insulating layer 124 in the first direction DR1 or the second direction DR2. The ratio of the width of the second insulating layer 124 in the first direction DR1 or the second direction DR2 to the height of the second insulating layer 124 is less than $10^{-5}$.

Materials of the first conductive component 121 and the second conductive component 123 may include metals. Examples of the metals may include, but are not limited to, aluminum (Al), silver (Ag), copper (Cu), molybdenum (Mo), chromium (Cr), tantalum (Ta), titanium (Ti), alloys thereof, or any combination of the foregoing. The materials of the first conductive component 121 and the second conductive component 123 may be the same or different. In some embodiments, the materials of the first conductive component 121 and the second conductive component 123 may include copper, but the disclosure is not limited thereto.

As shown in FIG. 2, the first conductive component 121 has sides 121S1, 121S2, 121S3, and 121S4. The second conductive component 123 has sides 123S1, 123S2, 123S3, and 123S4. Projection of the sides 121S1, 121S2, 121S3, and 121S4 of the first conductive component 121 onto the first substrate 11 are adjacent to projection of the sides 123S1, 123S2, 123S3, and 123S4 of the second conductive component 123 onto the substrate 11 respectively. In some embodiments, the sides 121S1 and 121S2 of the first conductive component 121 are substantially parallel to the sides 123S1 and 123S2 of the second conductive component 123. The sides 121S3 and 121S4 of the first conductive component 121 are substantially parallel to the sides 123S3 and 123S4 of the second conductive component 123, but the disclosure is not limited thereto.

The second conductive component 123 is disposed on the first conductive component 121 and the projection of the first conductive component 121 onto the first substrate 11 may overlap the projection of the second conductive component 123 onto the first substrate 11. In some embodiments, the projection of the first conductive component 121 onto the first substrate 11 is larger than the projection of the second conductive component 123 onto the first substrate 11. In some embodiments, the first side 123S1 of the second conductive component 123 is between the first side 121S1 and the second side 121S2 of the first conductive component 121, as shown in FIG. 3. In other embodiments, the second side 121S2 of the first conductive component 121 is between the first side 123S1 and the second side 123S2 of the second conductive component 123. In other embodiments, the second side 121S2 of the first conductive component 121 is align with the second side 123S2 of the second conductive component 123. That is, the projection of the second side 121S2 of the first conductive component 121 onto the first substrate 11 overlaps the projection of the second side 123S2 of the second conductive component 123 onto the first substrate 11.

The third conductive component 125 is formed on the first insulating layer 122 and the second insulating layer 124. The third conductive component 125 is electrically connected to the first conductive component 121 and the second conductive component 123 through the first via hole VH1 and the second via hole VH2, respectively. In some embodiments, the third conductive component 125 is conformally formed on the first insulating layer 122 and the sidewalls of the first via hole VH1 and the second via hole VH2. The third conductive component 125 is direct connected with the first conductive component 121 and the second conductive component 123. In some embodiments, the third conductive component 125 may be a conductive component having a light transmittance of over 70%. In this embodiment, the third conductive component 125 may include transparent conductive materials having a light transmittance of over 70%. The transparent conductive materials may include metal oxides. Examples of the metal oxides may include, but are not limited to, indium tin oxides (ITO), indium zinc oxides (IZO), zinc oxides, indium oxides, or any combination of the foregoing. In some embodiments, the third conductive component 125 may include indium tin oxides, but the disclosure is not limited thereto.

The third conductive component 125 has sides 125S1, 125S2, 125S3, and 125S4. The projection of the sides 125S1, 125S2, 125S3, and 125S4 of the third conductive component 125 onto the first substrate 11 are adjacent to the projection of the sides 121S1, 121S2, 121S3, and 121S4 of the first conductive component 121 onto the first substrate 11 respectively. The projection of the sides 125S1, 125S2, 125S3, and 125S4 of the third conductive component 125 onto the first substrate 11 are adjacent to the projection of the sides 123S1, 123S2, 123S3, and 123S4 of the second conductive component 123 onto the first substrate 11 respectively. In some embodiments, the sides 125S1 and 125S2 of the third conductive component 125 are parallel to the sides 121S1 and 121S2 of the first conductive component 121. In some embodiments, the sides 125S3 and 125S4 of the third conductive component 125 are substantially parallel to the sides 121S3 and 121S4 of the first conductive component 121. In some embodiments, the sides 125S1 and 125S2 of the third conductive component 125 are parallel to the sides

123S1 and 123S2 of the second conductive component 123. In some embodiments, the sides 125S3 and 125S4 of the third conductive component 125 are substantially parallel to the sides 123S3 and 123S4 of the second conductive component 123, but the disclosure is not limited thereto.

In some embodiments, the third conductive component 125 covers the first conductive component 121 and the second conductive component 123. In some embodiments, in the cross-sectional view of the electronic device 1, the width of the third conductive component 125 in the first direction DR1 may be greater than the width of the first conductive component 121, the width of the second conductive component 123, or the widths of the first conductive component 121 and the second conductive component 123 in the first direction DR1. In some embodiments, the width of the third conductive component 125 in the second direction DR2 may be greater than the width of the first conductive component 121, the width of the second conductive component 123, or the widths of the first conductive component 121 and the second conductive component 123 in the second direction DR2. In some embodiments, the length of the first side 125S1 of the third conductive component 125 is greater than the length of the first side 121S1 of the first conductive component 121 and the length of the first side 123S1 of the second conductive component 123. The first side 121S1 and the second side 121S2 of the first conductive component 121 and the first side 123S1 and the second side 123S2 of the second conductive component 123 are between the first side 125S1 and the second side 125S2 of the third conductive component 125. The third side 121S3 and the fourth side 121S4 of the first conductive component 121 and the third side 123S3 and the fourth side 123S4 of the second conductive component 123 are between the third side 125S3 and the fourth side 125S4 of the third conductive component 125. In other words, the projection of the third conductive component 125 onto the first substrate 11 is greater than the projection of the first conductive component 121 and the second conductive component 123 onto the first substrate 11. The projection of the first conductive component 121 and the second conductive component 123 onto the first substrate 11 are in the projection of the third conductive component 125 onto the first substrate 11.

In some embodiments, the third conductive component 125 may have a lowest height and a highest height. The so-called "lowest height" here refers to the height of the third conductive component 125 closest to the first substrate 11 in the cross-sectional view of the electronic device 1 as shown in FIG. 3. In other words, "the lowest height" refers to the minimum distance between the third conductive component 125 and the first substrate 11 in the third direction DR3. The so-called "the highest height" here refers to the height of the third conductive component 125 farthest from the first substrate 11 in the cross-sectional view of the electronic device 1 as shown in FIG. 3. In other words, "the highest height" refers to the maximum distance between the third conductive component 125 and the first substrate 11 in the third direction DR3. The first distance V is defined as the difference between the highest height and the lowest height of the third conductive component 125.

The first insulating island 14 is disposed on the conductive structure 12 and covers the conductive structure 12. Materials of the first insulating island 14 may include acrylic resins, polyamides, polyimides, novolac epoxy resins, other suitable materials, or any combination of the foregoing, but the disclosure is not limited thereto. In some embodiments, the materials of the first insulating island 14 may be the same as those of the second insulating island 17 or the fourth insulating island 19. The first insulating island 14 has sides 14S1, 14S2, 14S3, and 14S4. The projection of the sides 14S1, 14S2, 14S3, and 14S4 of the first insulating island 14 onto the first substrate 11 are adjacent to the projection of the sides 125S1, 125S2, 125S3, and 125S4 of the third conductive component 125 onto the first substrate 11 respectively. In some embodiments, the sides 14S1 and 14S2 of the first insulating island 14 are substantially parallel to the sides 125S1 and 125S2 of the third conductive component 125. In some embodiments, the sides 14S3 and 14S4 of the first insulating island 14 are substantially parallel to the sides 125S3 and 125S4 of the third conductive component 125, but the disclosure is not limited thereto. In some embodiments, the sides 14S1 and 14S2 of the first insulating island 14 extend along the second direction DR2. The sides 14S3 and 14S4 of the first insulating island 14 extend along the first direction DR1, but the disclosure is not limited thereto.

In some embodiments, in the cross-sectional view of the electronic device 1, the width W1 of the first insulating island 14 in the first direction DR1 may be greater than the width W2 of the third conductive component 125 in the first direction DR1. In some embodiments, in the cross-sectional view of the electronic device 1, the width W1' of the insulating island 14 in the second direction DR2 may be greater than the width W2' of the third conductive component 125 in the second direction DR2. That is, the length of the first side 14S1 of the first insulating island 14 may be longer than the length of the first side 125S1 of the third conductive component 125, and the length of the second side 14S2 of the first insulating island 14 may be longer than the length of the second side 125S2 of the conductive component 125. The length of the third side 14S3 of the first insulating island 14 may be longer than the length of the third side 125S3 of the third conductive component 125, and the length of the fourth side 14S4 of the first insulating island 14 may be longer than the length of the fourth side 125S4 of the third conductive component 125. The first side 125S1 and the second side 125S2 of the third conductive component 125 are between the first side 14S1 and the second side 14S2 of the first insulating island 14. The third side 125S3 and the fourth side 125S4 of the third conductive component 125 are between the third side 14S3 and the fourth side 14S4 of the first insulating island 14. In other words, projection of the first insulating island 14 onto the first substrate 11 is larger than the projection of the third conductive component 125 onto the first substrate 11. The projection of the third conductive component 125 onto the first substrate 11 is in the projection of the first insulating island 14 onto the first substrate 11. In this way, the first insulating island 14 may cover the third conductive component 125. The possibility of short circuit or damage in the electronic device 1 may be reduced. In some embodiments, minimum distances between the first side 14S1, the second side 14S2, the third side 14S3, and the fourth side 14S4 of the first insulating island 14 and the first side 125S1, the second side 125S2, the third side 125S3, and the fourth side 125S4 of the adjacent third conductive component 125 respectively, may be the same as or different from each other. In some embodiments, the minimum distance between the first side 14S1 and the first side 125S1, the minimum distance between the second side 14S2 and the second side 125S2, the minimum distance between the third side 14S3 and the third side 125S3, and the minimum distance between the fourth side 14S4 and the fourth side 125S4 may be larger than 1 micron (um), but the present disclosure is not limited thereto.

In some embodiments, in the cross-sectional view of the electronic device 1, the width of the first insulating island 14 in the first direction DR1 is greater than the width of the first via hole VH1, the width of the second via hole VH2, or the widths of the first via hole VH1 and the second via hole VH2 in the first direction DR1. The width of the first insulating island 14 in the second direction DR2 is greater than the width of the first via hole VH1, the width of the second via hole VH2, or the widths of the first via hole VH1 and the second via hole VH2 in the second direction DR2. The projection of the first insulating island 14 onto the first substrate 11 is larger than the projection of the first via hole VH1, the projection of the second via hole VH2, or the projection of the first via hole VH1 and the second via hole VH2 onto the first substrate 11. The projection of the first via hole VH1, the second via hole VH2, or the first via hole VH1 and the second via hole VH2 onto the first substrate 11 is in the projection of the first insulating island 14 onto the first substrate 11. Thereby, the first insulating island 14 may cover the first via hole VH1, the second via hole VH2, or the first via hole VH1 and the second via hole VH2, so that the first via hole VH1 and/or the second via hole VH2 may not be exposed. Accordingly, the possibility that moisture and/or compounds used during a process contacts the first conductive component 121, the second conductive component 123, and/or the third conductive component 125 through the first via hole VH1 and/or the second via hole VH2 may be reduced. In some embodiments, the possibility that the first conductive component 121, the second conductive component 123 and/or the third conductive component 125 is corroded may be reduced. In some embodiments, a portion of the first insulating island 14 may be disposed in the first via hole VH1 and/or the second via hole VH2 to prevent or reduce the possibility that moisture and/or compounds used during the manufacturing process contacts the first conductive component 121, the second conductive component 123, and/or the third conductive component 125.

The first insulating island 14 has a bottom portion 14B and a top portion 14T. The bottom portion 14B refers to a portion of the first insulating island 14 that is closest to the first substrate 11 in the cross-sectional schematic view of the electronic device 1 shown in FIG. 3. In other words, the bottom portion 14B refers to the portion of the first insulating island 14 that the distance between the first substrate 11 is the smallest in the third direction DR3. In some embodiments, the distance between the bottom portion 14B of the first insulating island 14 and the first substrate 11 is greater than or equal to 0.5 micrometer (um). In some embodiments, the distance between the bottom portion 14B of the first insulating island 14 and the first substrate 11 is between 0.5-3 microns (um). In some embodiments, the distance between the bottom portion 14B of the first insulating island 14 and the first substrate 11 is greater than or equal to 3 micrometers (um). The top portion 14T refers to the portion that the first insulating island 14 is furthest away from the first substrate 11 cross-sectional schematic view of the electronic device 1 shown in FIG. 3. In other words, the top portion 14T refers to the portion of the first insulating island 14 that the distance between and the first substrate 11 is the greatest in the third direction DR3. In some embodiments, the projection of the bottom portion 14B of the first insulating island 14 onto the first substrate 11 is larger than the projection of the top portion 14T of the first insulating island 14 onto the first substrate 11. The distance between the bottom portion 14B and the top portion 14T in the third direction DR3 is the thickness H of the first insulating island 14. The thickness H of the first insulating island 14 is greater than the first distance V between the highest height and the lowest height of the third conductive component 125. In some embodiments, the ratio of the thickness H of the first insulating island 14 to the first distance V between the highest height and the lowest height of the third conductive component 125 is greater than 1.1 (the thickness H:the first distance V is greater than 1.1:1). In some embodiments, the ratio of the thickness H to the first distance V is less than 3 (the thickness H:the first distance V is less than 3:1). In some embodiments, a difference between the thickness H and the first distance V is greater than or equal to 0.5 micrometers (um). Thereby, the top portion 14T of the first insulating island 14 is above the third conductive component 125, which may reduce the possibility of the third conductive component 125 being exposed and being worn or the first conductive component 121 and/or the second conductive component 123 being damaged.

In some embodiments, the height of the first insulating island 14 is lower than the height of the second insulating island 17 and/or the fourth insulating island 19. By making the height of the first insulating island 14 lower than the height of the second insulating island 17 and/or the fourth insulating island 19, the first insulating island 14 may prevent the first conductive component 121, the second conductive component 123, and/or the third conductive component 125 from being scratched, from disconnecting, or from failing due to external objects that fall during the manufacturing process. It should be noted that the "heights" of different components are calculated from the same level to the highest points of the different components. For example, starting from a top surface of the first substrate 11, the height of the first insulating island 14 is the shortest distance between the highest point of the first insulating island 14 and the top surface the first substrate 11, the height of the second insulating island 17 is a shortest distance between the highest point of the second insulating island 17 and the top surface the first substrate 11, and the height of the fourth insulating island 19 is a shortest distance between the highest point of the fourth insulating island 19 and the top surface the first substrate 11, but the present disclosure is not limited thereto.

In some embodiments, the thickness of the first insulating island 14 may be less than the width of the first insulating island 14 in the first direction DR1 or the second direction DR2. The ratio of the thickness of the insulating island 14 to the width of the first insulating island 14 in the first direction DR1 or the second direction DR2 is greater than $10^{-4}$. In some embodiments, the ratio of the thickness of the first insulating island 14 to the width of the first insulating island 14 in the first direction DR1 or the second direction DR2 is greater than the ratio of the thickness of the first insulating layer 122 to the width of the first insulating layer 122 in the first direction DR1 or the second direction DR2. In some embodiments, the ratio of the thickness of the first insulating island 14 to the width of the first insulating island 14 in the first direction DR1 or the second direction DR2 is greater than the ratio of the thickness of the second insulating layer 124 to the width of the second insulating layer 124 in the first direction DR1 or the second direction DR2. By making the first insulating island 14 have a special thickness-to-width ratio, the possibility of short circuit of the electronic device 1 may be prevented or reduced.

Figure 4:
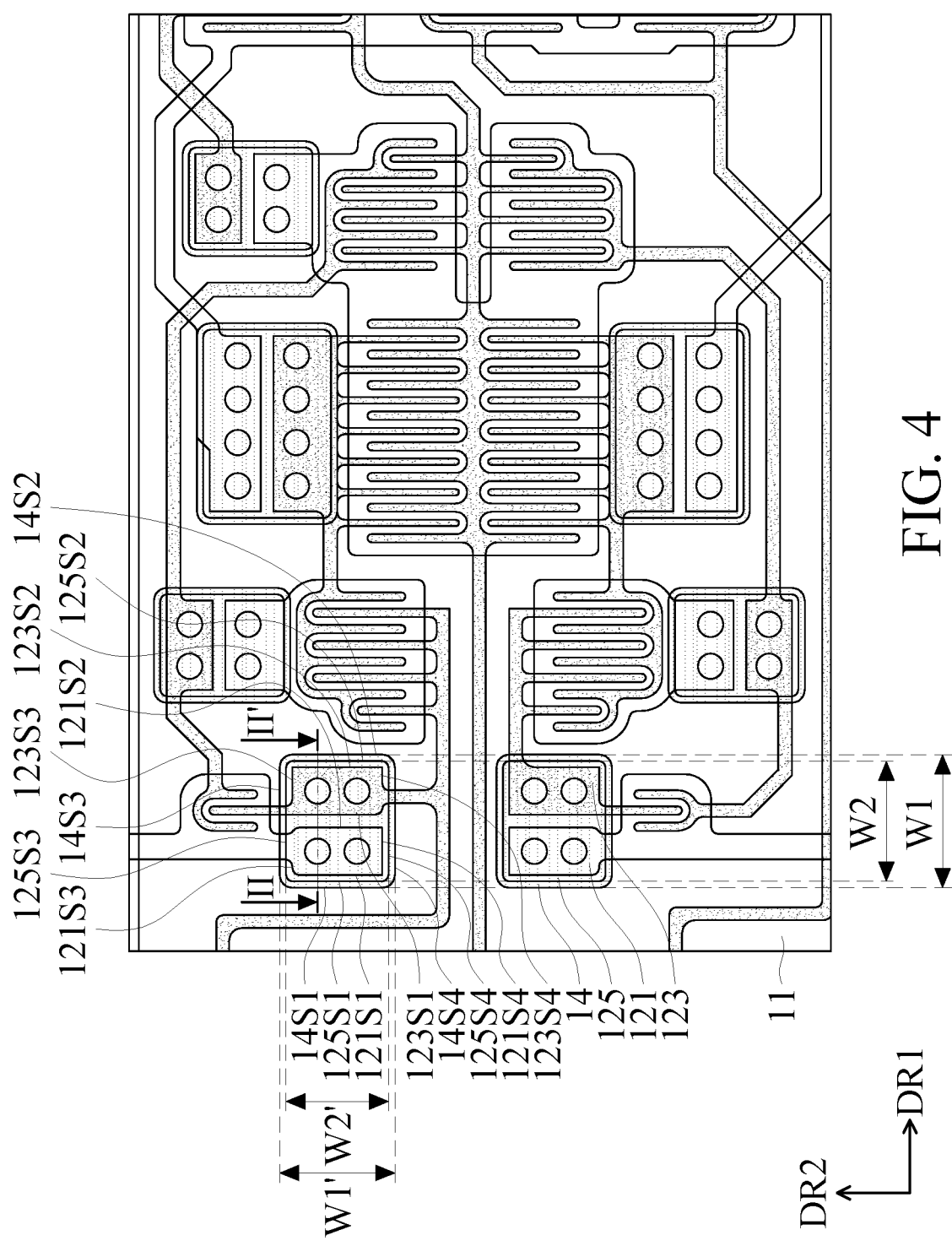
FIG. 4 shows an enlarged schematic view of a peripheral area of the electronic device shown in FIG. 1 according to another embodiment of the disclosure.
Figure 5:
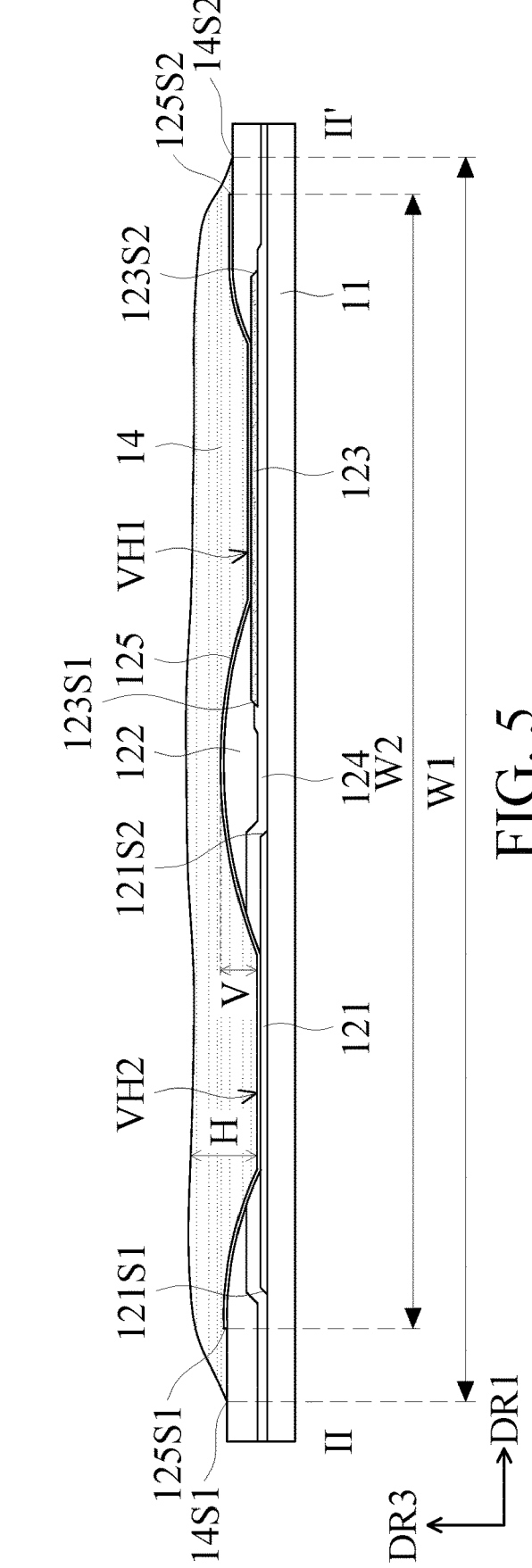
FIG. 5 shows a cross-sectional schematic view of an electronic device according to another embodiment of the present disclosure.

FIG. 4 shows an enlarged schematic view of a peripheral area of the electronic device 1 shown in FIG. 1 according to another embodiment of the disclosure. FIG. 5 shows a cross-sectional schematic view of an electronic device 1 taken along line II-IT according to another embodiment of the present disclosure. Except that the conductive structure 12 is different from the conductive structure 12 in FIG. 2, the electronic device shown in FIG. 4 has substantially the same structure as the electronic device shown in FIG. 2. The structure of the conductive structure 12 in the embodiment shown in FIG. 4 will be described in detail below, and the descriptions for other component will be omitted.

The conductive structure 12 and the first insulating island 14 covering the conductive structure 12 are in the peripheral area PA of the first substrate 11. The conductive structure 12 may be electrically connected to elements in the active area AA or transmit external signals to elements in the active area AA through conductive lines. The conductive structure 12 is disposed on the substrate. The conductive structure 12 includes a first conductive component 121, a first insulating layer 122, a second conductive component 123, a second insulating layer 124, and a third conductive component 125. The first conductive component 121 and the second conductive component 123 are disposed on the first substrate 11, and the third conductive component 125 is disposed on the first conductive component 121 and the second conductive component 123. The first insulating layer 122 is disposed between the first conductive component 121 and the third conductive component 125 and between the second conductive component 123 and the third conductive component 125. The second conductive component 123 is disposed on the second insulating layer 124, and the second insulating layer 124 is disposed between the first conductive component 121 and the second conductive component 123 and between the first insulating layer 122 and the first conductive component 121.

The first conductive component 121 and the second conductive component 123 do not overlap. That is, the projection of the first conductive component 121 onto the first substrate 11 does not overlap the projection of the second conductive component 123 onto the first substrate 11. The first side 123S1 of the second conductive component 123 is between the second side 121S2 of the first conductive component 121 and the second side 123S2 of the second conductive component 123. The second side 121S2 of the first conductive component 121 is between the first side 123S1 of the second conductive component 123 and the first side 121S1 of the first conductive component 121. The second side 121S2 of the first conductive component 121 and the first side 123S 1 of the second conductive component 123 are between the first side 121S1 of the first conductive component 121 and the second side 123S2 of the second conductive component 123.

The third conductive component 125 covers the first conductive component 121 and the second conductive component 123. In some embodiments, in the cross-sectional view of the electronic device 1, the width of the third conductive component 125 in the first direction DR1 may be greater than the sum of the widths of the first conductive component 121 and the second conductive component 123 in the first direction DR1. In other embodiments, the width of the third conductive component 125 in the second direction DR2 may be greater than the sum of the widths of the first conductive component 121 and the second conductive component 123 in the second direction DR2. The first side 121S1 and the second side 121S2 of the first conductive component 121 and the first side 123S1 and the second side 123S2 of the second conductive component 123 are between the first side 125S1 and the second side 125S2 of the third conductive component 125. The third side 121S3 and the fourth side 121S4 of the first conductive component 121 and the third side 123S3 and the fourth side 123S4 of the second conductive component 123 are between the third side 125S3 and the fourth side 125S4 of the third conductive component 125. In other words, the projection of the third conductive component 125 onto the first substrate 11 is greater than the projection of the first conductive component 121 and the second conductive component 123 onto the first substrate 11. The projection of the first conductive component 121 and the second conductive component 123 onto the first substrate 11 are in the projection of the third conductive component 125 onto the first substrate 11.

In some embodiments, the third conductive component 125 has a highest height and a lowest height. As shown in FIG. 5, the first distance V is defined as the difference between the highest height and the lowest height of the third conductive component 125.

The first insulating island 14 is disposed on the conductive structure 12 and covers the conductive structure 12, as shown in FIG. 4 and FIG. 5. Similar to the first insulating island 14 in the previous embodiment, in the embodiment of FIG. 5, in the cross-sectional view of the electronic device 1, the width of the first insulating island 14 in the first direction DR1 may be greater than the width of the third conductive component 125 in the first direction DR1. The width of the first insulating island 14 in the second direction DR2 may be greater than the width of the third conductive component 125 in the second direction DR2. The projection of the first insulating island 14 onto the first substrate 11 may be larger than the projection of the third conductive component 125 onto the first substrate 11. The projection of the third conductive component 125 onto the first substrate 11 may be in the projection of the first insulating island 14 onto the first substrate 11. In this way, the first insulating island 14 covers the third conductive component 125 so that the third conductive component 125 is not exposed and the possibility of short circuit of the electronic device 1 may be reduced.

Similarly, in some embodiments, in the cross-sectional view of the electronic device 1, the width of the first insulating island 14 in the first direction DR1 may be greater than the width of the first via hole VH1 and/or the second via hole VH2 in the first direction DR1. The width of the first insulating island 14 in the second direction DR2 may be greater than the width of the first via hole VH1 and/or the second via hole VH2 in the second direction DR2. The projection of the first insulating island 14 onto the first substrate 11 is larger than the projection of the first via hole VH1 and/or the second via hole VH2 onto the first substrate 11. The projection of the first via hole VH1 and/or the second via hole VH2 onto the first substrate 11 is in the projection of the first insulating island 14 onto the first substrate 11. Thereby, the first insulating island 14 covers the first via hole VH1 and/or the second via hole VH2, so that the first via hole VH1 and/or the second via hole VH2 are not exposed. Accordingly, the possibility that moisture and/or compounds used during the manufacturing process contacts the first conductive component 121, the second conductive component 123, and/or the third conductive component 125 through the first via hole VH1 and/or the second via hole VH2 may be reduced. In some embodiments, the possibility that the first conductive component 121, the second conductive component 123 and/or the third conductive component 125 is corroded may be reduced. In some embodiments, a portion of the first insulating island 14 formed on the third conductive component 125 may be disposed in the first via hole VH1 and/or the second via hole VH2. Accordingly, moisture in the environment may be prevented from entering the electronic device 1, the possibility that moisture and/or compounds used during the manufacturing process contacts the first conductive component 121, the second conductive component 123, and/or the third conductive component 125 may be reduced, or the possibility that the first conductive component 121 and/or the second conductive component 123 is oxidized due to a high voltage signal of a peripheral circuit may be reduced.

Figure 6:
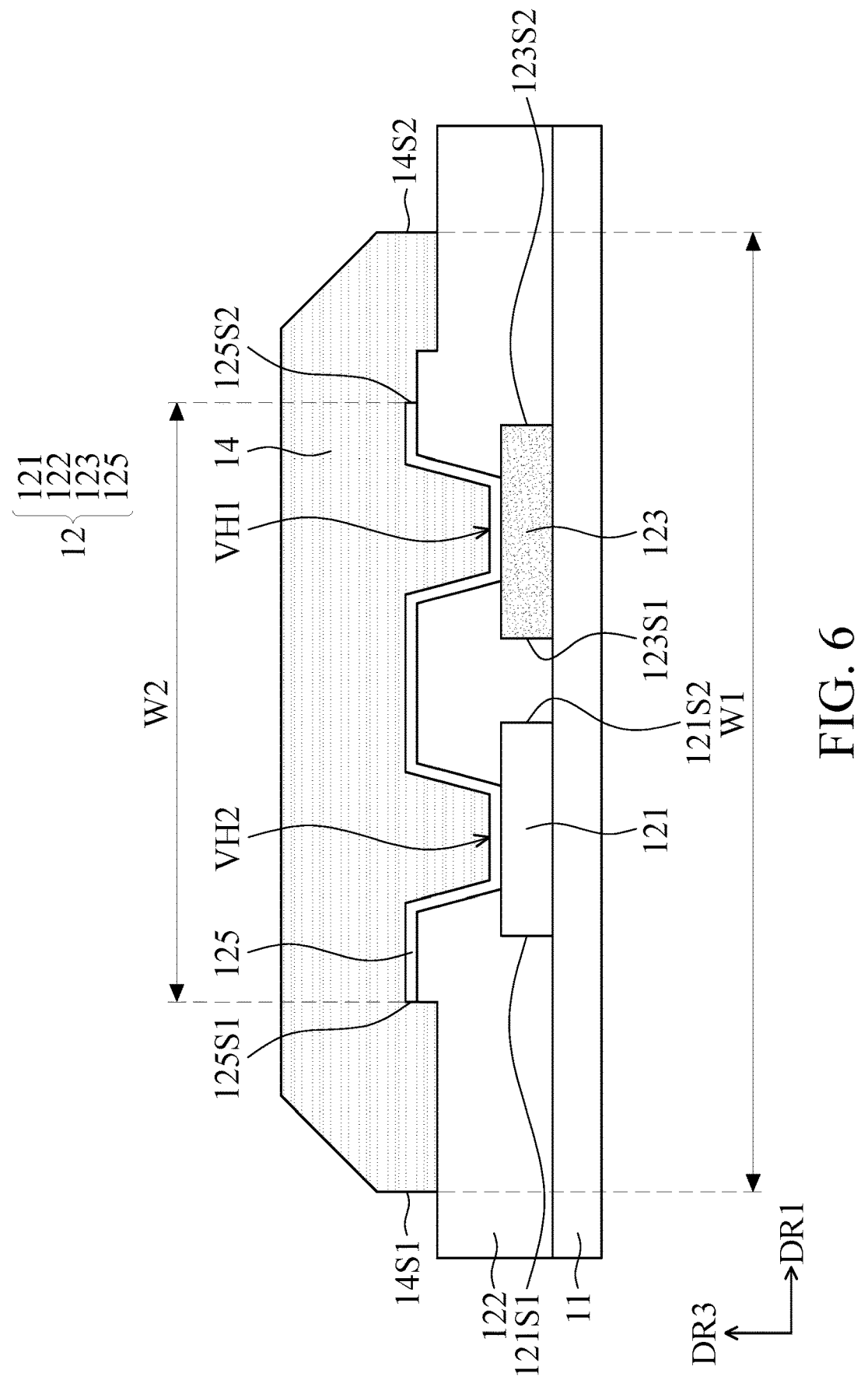
FIG. 6 shows a cross-sectional schematic view of an electronic device according to another embodiment of the present disclosure.

FIG. 6 shows a cross-sectional schematic view of an electronic device 1 shown in FIG. 4 taken along line II-IT according to another embodiment of the present disclosure. In the embodiment of FIG. 6, the conductive structure 12 includes a first conductive component 121, a first insulating layer 122, a second conductive component 123, and a third conductive component 125. The first conductive component 121 and the second conductive component 123 are disposed on the first substrate 11, and the third conductive component 125 is disposed on the first conductive component 121 and the second conductive component 123. The first conductive component 121 and the second conductive component 123 are disposed in the same layer. That is, the first conductive component 121 and the second conductive component 123 may be made from the same layer. The first insulating layer 122 is disposed on the first conductive component 121 and the second conductive component 123, between the third conductive component 125 and the first conductive component 121, and between the third conductive component 125 and the second conductive component 123. The materials of the first conductive component 121, the second conductive component 123, the third conductive component 125, and the first insulating layer 122 may be the same as those described in the previous embodiments, so it will not be repeated here.

In the embodiment shown in FIG. 6, the first via hole VH1 and the second via hole VH2 penetrate the first insulating layer 122. The first insulating layer 122 may have a plurality of first via holes VH1 and second via holes VH2. The third conductive component 125 is formed on the first insulating layer 122 and electrically connected to the first conductive component 121 and the second conductive component 123 through the first via hole VH1 and the second via hole VH2 respectively. In some embodiments, the third conductive component 125 has a highest height and a lowest height. As shown in FIG. 6, the first distance V is defined as the difference between the highest height and the lowest height.

The first insulating island 14 is disposed on the conductive structure 12 and covers the entire conductive structure 12, as shown in FIG. 4 and FIG. 6. The materials, structure, and function of the first insulating island 14 shown in FIG. 6 are similar to those of the first insulating island 14 in the previous embodiment, so it will not be repeated here. Similar to the first insulating island 14 in the previous embodiment, in the embodiment shown in FIG. 6, in the cross-sectional view of the electronic device 1, the width of the first insulating island 14 in the first direction DR1 may be greater than the width of the third conductive component 125 in the first direction DR1. The width of the first insulating island 14 in the second direction DR2 may be greater than the width of the third conductive component 125 in the second direction DR2. The projection of the first insulating island 14 onto the first substrate 11 may be larger than the projection of the third conductive component 125 onto the first substrate 11. The projection of the third conductive component 125 onto the first substrate 11 may be in the projection of the first insulating island 14 onto the first substrate 11. Thereby, the possibility of short circuit of the electronic device 1 may be prevented or reduced by the first insulating island 14. Similarly, a portion of the first insulating island 14 formed on the third conductive component 125 may be disposed in the first via hole VH1 and/or the second via hole VH2. In the embodiment shown in FIG. 6, the projection of the first insulating island 14 onto the first substrate 11 may be larger than the projection of the first via hole VH1 and/or the second via hole VH2 onto the first substrate 11. The projection of the first via hole VH1 and/or the second via hole VH2 onto the first substrate 11 may be in the projection of the first insulating island 14 onto the first substrate 11. Accordingly, moisture in the environment may be prevented from entering the electronic device 1, the possibility that moisture and/or compounds used during the manufacturing process contacts the first conductive component 121, the second conductive component 123, and/or the third conductive component 125 may be reduced, or the possibility that the first conductive component 121 and/or the second conductive component 123 is oxidized due to a high voltage signal of a peripheral circuit may be reduced.

Figure 7:
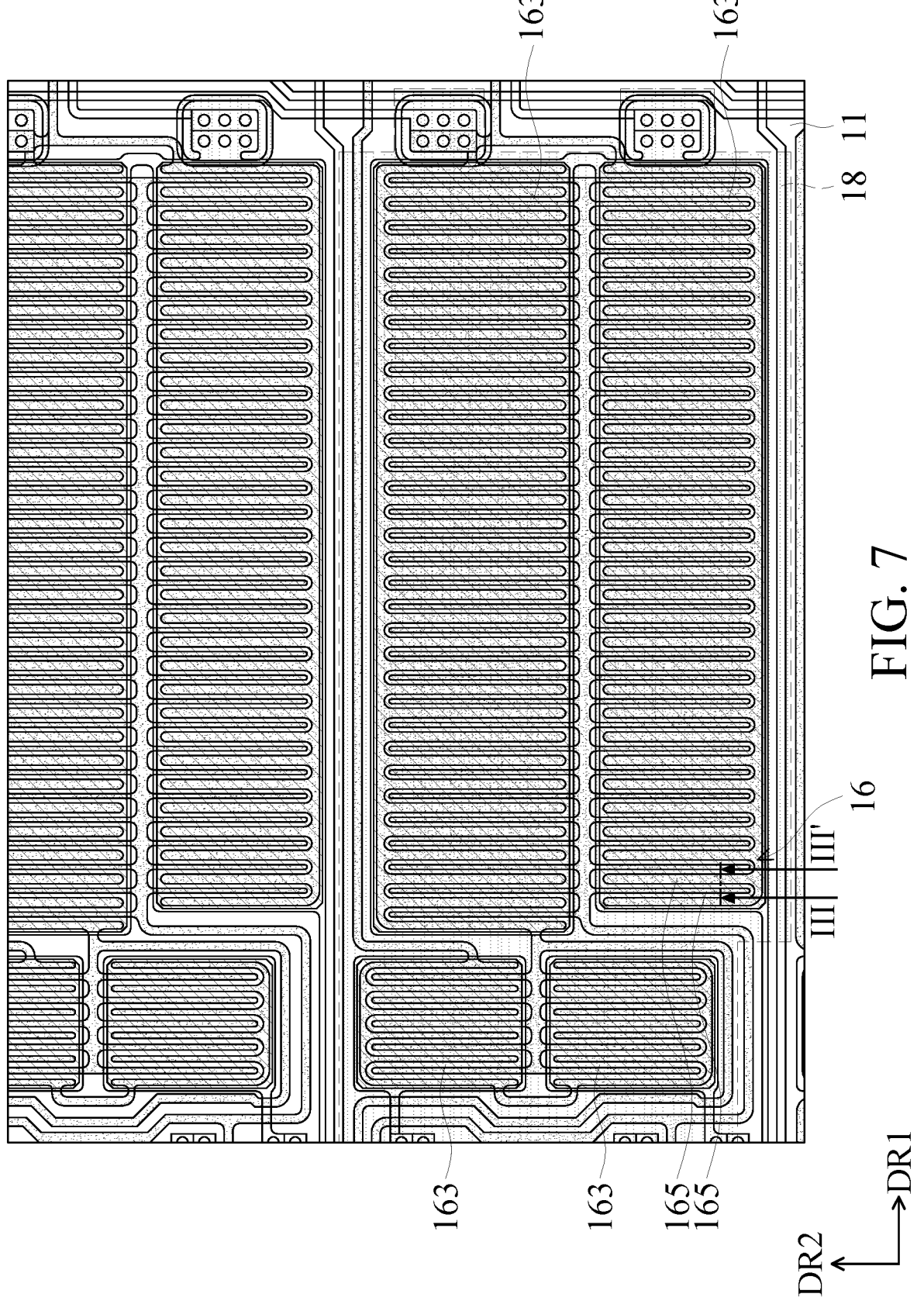
FIG. 7 shows an enlarged schematic view of a peripheral area of the electronic device shown in FIG. 1 according to another embodiment of the disclosure.

FIG. 7 shows an enlarged schematic view of the peripheral area PA of the electronic device 1 shown in FIG. 1 according to an embodiment of the disclosure. As shown in FIG. 7, in addition to the structures described above with reference to FIGS. 1 to 6, the electronic device 1 may further include a transistor 16 and a third insulating island 18. The transistor 16 and the third insulating island 18 are disposed in the peripheral area PA of the first substrate 11.

Figure 8A:
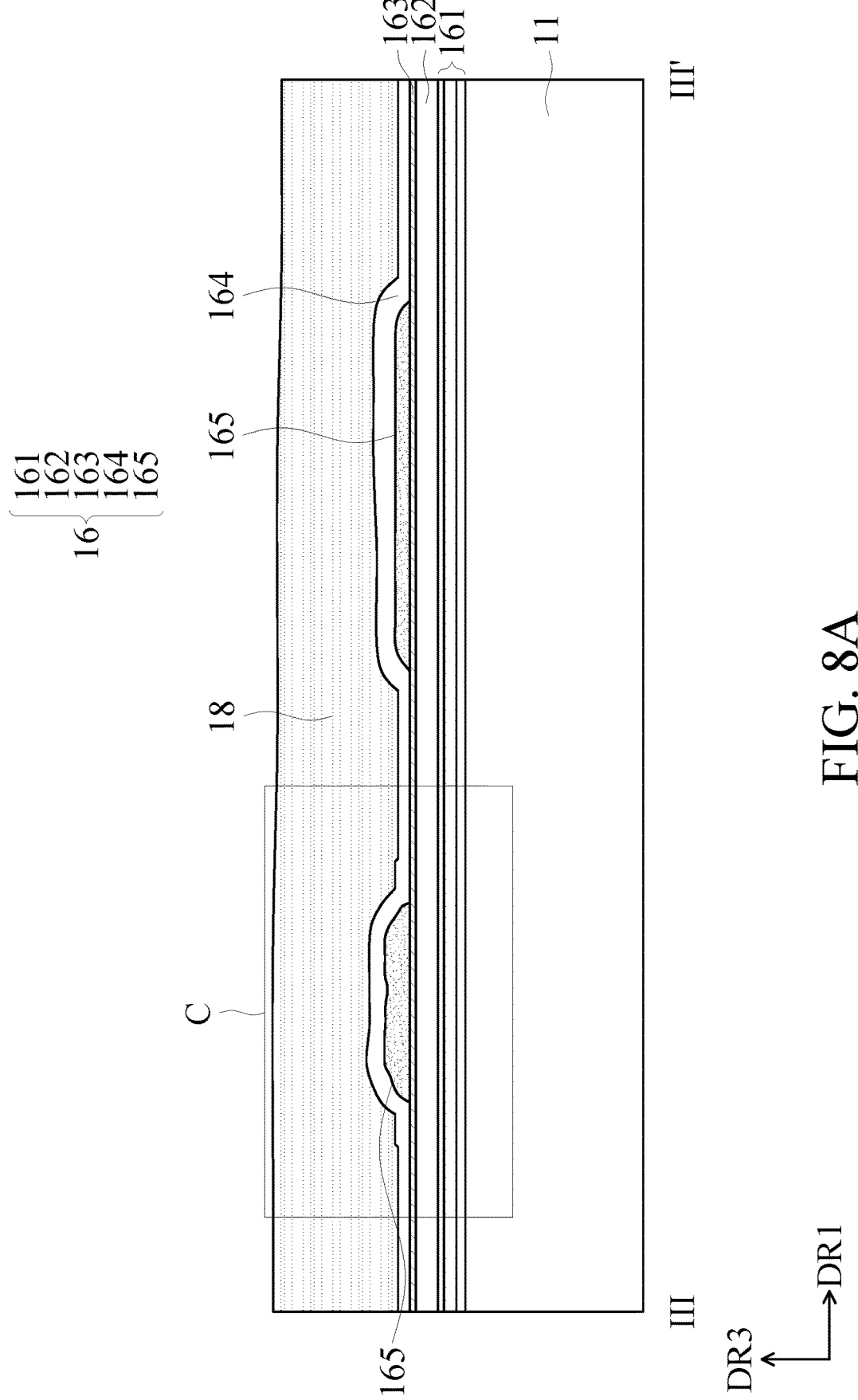
FIG. 8A shows a cross-sectional schematic view of an electronic device according to another embodiment of the present disclosure.

FIG. 8A shows a cross-sectional schematic view of the electronic device 1 shown in FIG. 7 taken along line III-III' according to an embodiment of the present disclosure. FIG. 8B shows an enlarged schematic view of an area C of the electronic device shown in FIG. 8A according to another embodiment of the disclosure. As shown in FIG. 8A and FIG. 8B, the transistor 16 includes a gate electrode 161, source/drain electrodes 165, a semiconductor component 163 between the gate electrode 161 and the source/drain electrodes 165, a third insulating layer 162 and a fourth insulating layer 164. The third insulating layer 162 is disposed between the gate electrode 161 and the semiconductor component 163 and insulates the gate electrode 161 from the semiconductor component 163. The fourth insulating layer 164 is disposed on the source/drain electrodes 165. The fourth insulating layer 164 covers the gate electrode 161, the source/drain electrodes 165, and the semiconductor component 163. In some embodiments, the projection of the fourth insulating layer 164 onto the first substrate 11 is greater than projection of the gate electrode 161, the source/drain electrodes 165, and/or the semiconductor component 163 onto the first substrate 11. The projection of the gate electrode 161, the source/drain electrodes 165, and/or the semiconductor component 163 onto the first substrate 11 are in the projection of the fourth insulating layer 164 onto the first substrate 11.

The third insulating island 18 is disposed on the transistor 16 and covers the gate electrode 161, the source/drain electrodes 165, and/or the semiconductor component 163 of the transistor 16. The materials of the third insulating island 18 may include acrylic resins, polyamides, polyimides, novolac epoxy resins, organic photoresists, other suitable materials, or any combination of the foregoing, but the disclosure is not limited thereto. In some embodiments, in the cross-sectional view of the electronic device 1, the width of the third insulating island 18 in the first direction DR1 may be greater than the width of the semiconductor component 163 in the first direction DR1. The width of the third insulating island 18 in the second direction DR2 may be greater than the width of the semiconductor component 163 in the second direction DR2. In some embodiments, the projection of the third insulating island 18 onto the first substrate 11 may be greater than the projection of the gate electrode 161, the source/drain electrodes 165, and/or the semiconductor component 163 onto the first substrate 11. The projection of the gate electrode 161, the source/drain electrodes 165, and/or the semiconductor component 163 onto the first substrate 11 may be in the projection of the third insulating island 18 onto the first substrate 11. Thereby, the third insulating island 18 may cover the gate electrode 161, the source/drain electrodes 165, and/or the semiconductor component 163, so that the gate electrode 161, the source/drain electrodes 165, and/or the semiconductor component 163 is not exposed.

In some embodiments, a bottom portion of the third insulating island 18 is larger than a top portion thereof. That is, the projection of the bottom portion of the third insulating island 18 onto the first substrate 11 is larger than the projection of the top portion of the third insulating island 18 onto the first substrate 11. The projection of the top portion of the third insulating island 18 onto the first substrate 11 is in the projection of the bottom portion of the third insulating island 18 onto the first substrate 11. In some embodiments, the distance between the bottom portion of the third insulating island 18 and the first substrate 11 is greater than 0.5 micrometer (um). In some embodiments, the distance between the bottom portion of the third insulating island 18 and the first substrate 11 is between 0.5-3 microns (um). In some embodiments, the distance between the bottom portion of the third insulating island 18 and the first substrate 11 is greater than 3 micrometers (um).

In some embodiments, the height of the third insulating island 18 is lower than the height of the second insulating island 17 and/or the fourth insulating island 19. By making the height of the third insulating island 18 lower than the height of the second insulating island 17 and/or the height of the fourth insulating island 19, the transistor 16 may be prevented from being scratched, from disconnecting, or from failing due to external objects that fall during the manufacturing process by the third insulating island 18. In some embodiments, the thickness of the third insulating island 18 is less than the width of the third insulating island 18 in the first direction DR1 or the second direction DR2. The ratio of the thickness of the third insulating island 18 to the width of the third insulating island 18 in the first direction DR1 or the second direction DR2 is greater than $10^{-4}$. In some embodiments, the ratio of the thickness of the third insulating island 18 to the width of the third insulating island 18 in the first direction DR1 or the second direction DR2 is greater than the ratio of the thickness of the first insulating layer 122 to the width of the first insulating layer 122 in the first direction DR1 or the second direction DR2. In some embodiments, the ratio of the thickness of the third insulating island 18 to the width of the third insulating island 18 in the first direction DR1 or the second direction DR2 is greater than the ratio of the thickness of the second insulating layer 124 to the width of the second insulating layer 124 in the first direction DR1 or the second direction DR2. By making the third insulating island 18 have a special thickness-to-width ratio, the possibility of short circuit of the electronic device 1 may be prevented or reduced.

In the embodiment shown in FIG. 7, the third insulating island 18 may cover a plurality of transistors 16, but the present disclosure is not limited thereto. In an embodiment where the third insulating island 18 covers a plurality of transistors 16, in the cross-sectional view of the electronic device 1, the width of the third insulating island 18 is greater than the sum of the widths of the semiconductor components 163 of the plurality of transistors 16 covered by the third insulating island 18. The width of the third insulating island 18 in the first direction DR1 may be greater than the sum of the widths of the semiconductor components 163 of the transistor 16 covered by the third insulating island 18 in the first direction DR1. The width of the third insulating island 18 in the second direction DR2 may be greater than the sum of the widths of the semiconductor components 163 of the transistor 16 covered by the third insulating island 18 in the second direction DR2. In some embodiments, the third insulating island 18 covers the gate electrode 161, the source/drain electrodes 165, and/or the semiconductor component 163 in the plurality of transistors 16. The projection of the plurality of transistors 16 onto the first substrate 11 is larger than the projection of the third insulating island 18 onto the first substrate 11. Accordingly, moisture in the environment may be prevented from entering the electronic device 1, the possibility that moisture and/or compounds used during the manufacturing process contacts the transistors 16 may be reduced, or the possibility that the gate electrode 161 and/or the source/drain electrodes 165 of the transistors 16 is oxidized due to a high voltage signal of a peripheral circuit may be reduced by the third insulating island 18.

Figure 9:
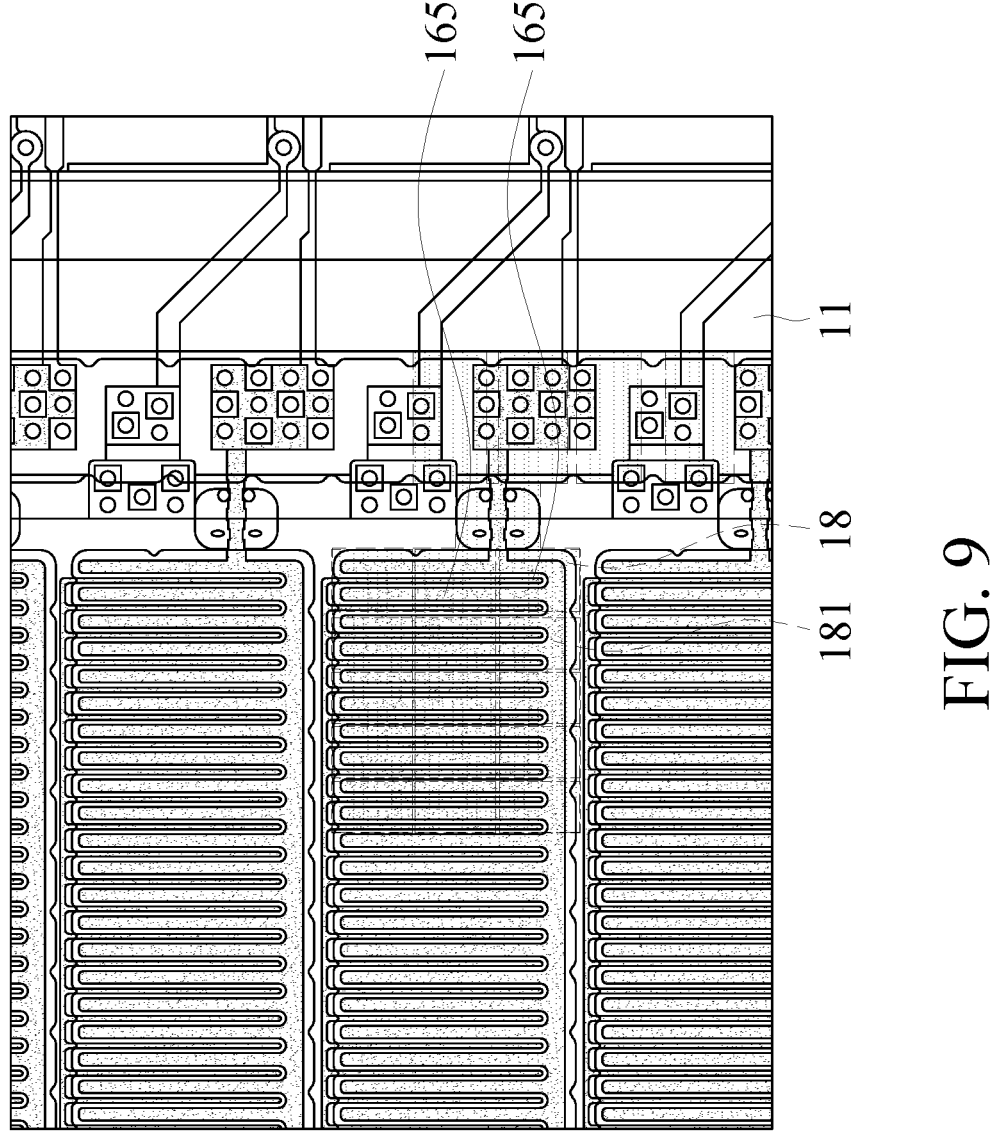
FIG. 9 shows an enlarged schematic view of a peripheral area of the electronic device shown in FIG. 1 according to another embodiment of the disclosure.

FIG. 9 shows an enlarged schematic view of a peripheral area of the electronic device 1 shown in FIG. 1 according to another embodiment of the disclosure. In the embodiment shown in FIG. 9, the third insulating island 18 includes a plurality of sub-insulating islands 181. Materials of the sub-insulating islands 181 may include acrylic resins, polymides, polyimides, novolac epoxy resins, organic photoresists, other suitable materials, or any combination of the foregoing, but the disclosure is not limited thereto. Each sub-insulating islands 181 covers the gate electrode 161, the source/drain electrodes 165, and/or the semiconductor component 163 of at least one transistors 16. In some embodiments, in the cross-sectional view of the electronic device 1, the width of the sub-insulating island 181 is greater than the width of the semiconductor component 163 of one transistor 16. The width of the sub-insulating island 181 in the first direction DR1 may be greater than the width of the semiconductor component 163 of one transistor 16 in the first direction DR1. The width of the sub-insulating island 181 in the second direction DR2 may be greater than the width of the semiconductor component 163 of one transistor 16 in the second direction DR2. In some embodiments, the projection of the sub-insulating island 181 onto the first substrate 11 is greater than the projection of the gate electrode 161, the source/drain electrodes 165, and/or the semiconductor component 163 of the at least one transistor 16 onto the first substrate 11. The projection of the gate electrode 161, the source/drain electrodes 165, and/or the semiconductor component 163 of the at least one transistor 16 onto the first substrate 11 is in the projection of the sub-insulating island 181 onto the first substrate 11. Accordingly, moisture in the environment may be prevented from entering the electronic device 1, the possibility that moisture and/or compounds used during the manufacturing process contacts the transistors 16 may be reduced, or the possibility that the gate electrode 161 and/or the source/drain electrodes 165 of the transistors 16 is oxidized due to a high voltage signal of a peripheral circuit may be reduced by the sub-insulating islands 181.

In some embodiments, the height of the sub-insulating island 181 is lower than the height of the second insulating island 17 and/or the fourth insulating island 19. By making the height of the sub-insulating island 181 lower than the height of the second insulating island 17 and/or the height of the fourth insulating island 19, the transistor 16 may be prevented from being scratched, from disconnecting, or from failing due to external objects that fall during the manufacturing process by the sub-insulating island 181. In some embodiments, the sub-insulating islands 181 are spaced apart from each other by a distance.

In some embodiments, the third insulating island 18 may further include connecting portions connecting adjacent sub-insulating islands 181 of the plurality of sub-insulating island 181. In some embodiments, all the sub-insulating islands 181 may be connected by the connecting portions, but the present disclosure is not limited thereto. In some embodiments, the connecting portions may connect some of the sub-insulating island 181 as needed, but the disclosure is not limited thereto.

By forming the insulating islands on the conductive structures and/or transistors, the present disclosure may reduce the risk of damaging the conductive structures and/or transistors due to external objects that fall during the manufacturing process and/or compounds used during the manufacturing process, and/or moisture in the environment. The possibility of short circuits or failure of the electronic devices may be reduced.

While the disclosure has been described by way of example and in terms of the preferred embodiments, it should be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electronic device, comprising:
   a substrate;
   a conductive structure disposed on the substrate and comprising a first conductive component, a second conductive component, and a third conductive component, wherein the third conductive component is disposed on the first conductive component and the second conductive component and electrically connected to the first conductive component and the second conductive component;
   a first insulating island disposed on the conductive structure;
   a first insulating layer disposed between the second conductive component and the third conductive component, wherein the first insulating layer has a plurality of first via holes, and the third conductive component is electrically connected to the second conductive component through the plurality of first via holes, and in a cross-sectional view of the electronic device, a width of the first insulating island is greater than a width of the third conductive component.

2. The electronic device as claimed in claim 1, wherein in the cross-sectional view of the electronic device, a thickness of the first insulating island is greater than a first distance between a highest height and a lowest height of the third conductive component.

3. The electronic device as claimed in claim 2, wherein a ratio of the thickness of the first insulating island to the first distance is greater than 1.1.

4. The electronic device as claimed in claim 1, wherein in the cross-sectional view of the electronic device, a side of the third conductive component is adjacent to a side of the first insulating island, and a minimum distance between the side of the third conductive component and the side of the first insulating island is greater than 1 micron (um).

5. The electronic device as claimed in claim 1, wherein a portion of the first insulating island is disposed in the plurality of first via holes.

6. The electronic device as claimed in claim 1, further comprising a second insulating layer disposed between the first conductive component and the second conductive component, wherein the second conductive component overlaps the first conductive component.

7. The electronic device as claimed in claim 1, further comprising a second insulating layer disposed between the first conductive component and the second conductive component, wherein the second conductive component and the first conductive component do not overlap.

8. The electronic device as claimed in claim 1, wherein the first conductive component and the second conductive component are made from the same layer.

9. The electronic device as claimed in claim 1, wherein the first conductive component and the second conductive component comprises metals and the third conductive component comprises transparent conductive materials.

10. The electronic device as claimed in claim 1, wherein the substrate comprises an active area and a peripheral area adjacent to the active area and the conductive structure is disposed in the peripheral area.

11. The electronic device as claimed in claim 10, further comprising a second insulating island disposed in the active area, wherein materials of the second insulating island are the same as those of the first insulating island that is disposed in the peripheral area.

12. The electronic device as claimed in claim 11, further comprising a fourth insulating island disposed in the peripheral area, wherein materials of the fourth insulating island are the same as those of the first insulating island that is disposed in the peripheral area.

13. The electronic device as claimed in claim 12, wherein a height of the second insulating island is greater than or equal to a height of the fourth insulating island.

14. The electronic device as claimed in claim 12, wherein a height of the first insulating island is lower than a height of at least one of the second insulating island and the fourth insulating island.

15. The electronic device as claimed in claim 10, further comprising a transistor disposed in the peripheral area and a third insulating island disposed on the transistor, wherein the transistor comprises a semiconductor component, and in the cross-sectional view of the electronic device, a width of the third insulating island is greater than a width of the semiconductor component.

16. The electronic device as claimed in claim 10, further comprising a plurality of transistors disposed in the peripheral area and a third insulating island disposed on the plurality of transistors, wherein each of the plurality of transistors comprises a semiconductor component, and in the cross-sectional view of the electronic device, a width of the third insulating island is greater than a sum of widths of the semiconductor components.

17. The electronic device as claimed in claim 16, wherein the third insulating island comprises a plurality of sub-insulating islands, and each sub-insulating island covers at least one of the plurality of transistors.

18. The electronic device as claimed in claim 17, wherein in the cross-sectional view of the electronic device, a width of each sub-insulating island is greater than a width of the semiconductor component of the covered transistor.

19. The electronic device as claimed in claim 18, wherein the third insulating island further comprises connecting portions connecting adjacent sub-insulating islands of the plurality of sub-insulating islands.

* * * * *